(12) United States Patent
Sinha et al.

(10) Patent No.: US 8,034,315 B2
(45) Date of Patent: Oct. 11, 2011

(54) METHODS OF FORMING DEVICES COMPRISING CARBON NANOTUBES

(75) Inventors: Nishant Sinha, Boise, ID (US); Gurtej S. Sandhu, Boise, ID (US); Eugene Marsh, Boise, ID (US); Neil Greeley, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 456 days.

(21) Appl. No.: 12/235,244

(22) Filed: Sep. 22, 2008

(65) Prior Publication Data

US 2010/0276656 A1    Nov. 4, 2010

(51) Int. Cl.
 *H01L 29/72* (2006.01)
(52) U.S. Cl. .................. 423/447.1; 977/712; 977/721; 977/745; 977/748; 977/764; 977/765; 977/781
(58) Field of Classification Search ............... 423/447.1; 977/712, 721, 745, 748, 764, 765, 781
See application file for complete search history.

(56) References Cited

U.S. PATENT DOCUMENTS

| | | | |
|---|---|---|---|
| 7,348,675 B2 * | 3/2008 | Dubin et al. | 257/774 |
| 2006/0103694 A1 | 5/2006 | Nguyen | |
| 2007/0164430 A1 | 7/2007 | Lin et al. | |
| 2007/0179050 A1 | 8/2007 | Ma et al. | |
| 2008/0067619 A1 | 3/2008 | Farahani et al. | |
| 2009/0050601 A1 * | 2/2009 | Park et al. | 216/13 |

OTHER PUBLICATIONS

Abderrafik Nemamcha, et al. "Synthesis of Palladium Nanoparticles by Sonochemical Reduction of Palladium(II) Nitrate in Aqueous Solution" J. Phys. Chem. B, 2006, vol. 110, pp. 383-387.

* cited by examiner

*Primary Examiner* — Edward Wojciechowicz
(74) *Attorney, Agent, or Firm* — Wells St. John P.S.

(57) ABSTRACT

Some embodiments include devices that contain bundles of CNTs. An undulating topography extends over the CNTs and within spaces between the CNTs. A global maximum lateral width is defined as the greatest lateral width of any of the spaces. A material is directly over the CNTs, with the material being a plurality of particles that have minimum cross-sectional equatorial widths exceeding the global maximum lateral width. Some embodiments include methods in which a plurality of crossed carbon nanotubes are formed over a semiconductor substrate. The CNTs form an undulating upper topography extending across the CNTs and within spaces between the CNTs. A global maximum lateral width is defined as the greatest lateral width of any of the spaces. A material is deposited over the CNTs, with the material being deposited as particles that have minimum cross-sectional equatorial widths exceeding the global maximum lateral width.

16 Claims, 11 Drawing Sheets

_FIG. 1_

_FIG. 2_

_FIG 5_

_FIG 6_

_Fig. 21_

_Fig. 22_

_Fig. 23_

METHODS OF FORMING DEVICES COMPRISING CARBON NANOTUBES

TECHNICAL FIELD

Devices comprising carbon nanotubes, and methods of forming devices comprising carbon nanotubes.

BACKGROUND

Carbon nanotubes (CNTs) are of interest in utilization in various devices utilized in semiconductor constructions, including, for example, devices utilized in integrated circuitry (IC) and devices utilized in micro-electro-mechanical systems (MEMS). Carbon nanotubes are allotropes of carbon, and are cylindrical molecules. The cylinders may have maximum widths (e.g., diameters if the cylinders are circular in cross-section) of less than 100 nanometers, less than 50 nanometers, or even less than 2 nanometers; and may have lengths that are tens, hundreds, thousands, or even millions of times greater than the maximum widths.

Among the properties that make CNTs of interest are high chemical stability, high thermal stability, small size, and conductive properties that may be tailored to be either metal-like or semiconductor-like.

Although CNTs have properties that may make them suitable for incorporation into semiconductor devices, there are also numerous problems and difficulties encountered in attempting to incorporate CNTs into semiconductor devices. For instance, conductive properties of CNTs may be significantly altered if metals, oxides or other contaminants comingle with the CNTs.

An active area of interest in integrated circuitry is in attempting to transition from single level cells (SLCs) to multilevel cells (MLCs). MLCs differ from SLCs in the amount of data that may be stored in the devices. Specifically, an SLC device has only two different states (which may be identified as states 0 and 1), and thus stores only a single data bit. In contrast, an MLC device has at least four different states (which may be identified as states 11, 01, 00, and 10 for a four-state device), and thus stores at least two data bits. Accordingly, at least twice as much information may be stored in an MLC as can be stored in an SLC.

An interesting property of CNTs is that if a plurality of CNTs are bundled together, and arranged so that the CNTs cross one another throughout the bundle (in other words, are askew with one another rather than parallel to one another), the bundle may have four or more distinguishable electrical states. Accordingly, CNTs show promise for utilization in MLC devices. However, it is difficult to form MLC devices comprising CNT bundles in that the electrical properties of the CNT bundles may be significantly altered if contaminants enter the bundles.

It would be desirable to develop new methods for incorporating CNTs into semiconductor devices, and to develop new devices comprising CNTs.

BRIEF DESCRIPTION OF THE DRAWINGS

FIGS. 12-14 are illustrated in accordance with the way shown in FIG. 10.

DETAILED DESCRIPTION OF THE ILLUSTRATED EMBODIMENTS

In some embodiments, a bundle of crossed CNTs is provided over a semiconductor substrate, and then material is deposited over and in direct contact with the CNTs. The material is comprised of a plurality of particles, with every particle having sufficient size that it does not fall into the CNT bundle. The material may be electrically insulative in some embodiments, and utilized as a passivation layer over the CNT bundle; may be semiconductive in some embodiments; or may be electrically conductive in other embodiments, and utilized to make electrical contact to the CNT bundle. Example embodiments are described with reference to FIGS. 1-27.

Figure 1:
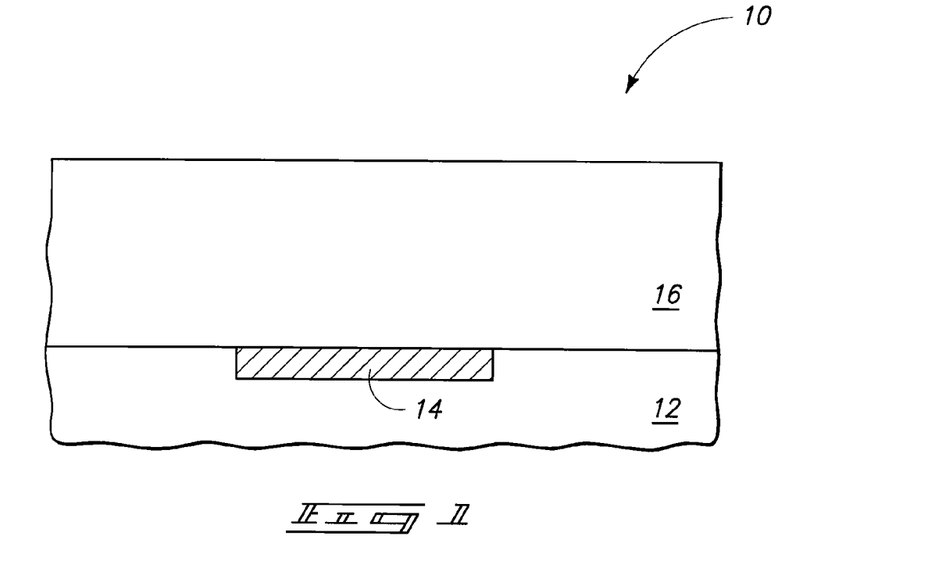
FIG. 1 is a diagrammatic, cross-sectional view of a portion of a semiconductor construction at a processing stage of an example embodiment.

Referring to FIG. 1, a portion of a semiconductor construction 10 is illustrated. Construction 10 includes a semiconductor substrate 12, an electrically conductive node 14 supported by the substrate, and an electrically insulative material 16 over the substrate.

Substrate 12 may comprise, for example, monocrystalline semiconductor material appropriately doped with background-type dopant; and in some embodiments may comprise, consist essentially of, or consist of monocrystalline silicon lightly doped with background p-type dopant.

Although substrate 12 is illustrated to be homogeneous, in other embodiments the substrate may comprise multiple different materials. For instance, the substrate may comprise one or more layers associated with integrated circuit fabrication. Such layers may include an electrically insulative material (for instance, a material comprising one or more of silicon nitride, silicon oxynitride, various oxides, etc.), an electrically conductive layer (for instance, a material comprising one or more of metal, metal nitride, metal silicide, etc.), and/or a semiconductor material (for instance, a material comprising one or more of silicon, germanium, etc.).

The terms "semiconductive substrate" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

Electrically conductive node 14 may comprise any suitable electrically conductive composition or combination of compositions. Node 14 may, for example, comprise a conductively-doped region of a monocrystalline silicon substrate, one or more metals (for instance, tungsten, titanium, platinum, palladium, cobalt, etc.), and/or one or more metal-containing compositions (for instance, metal silicide, metal nitride, etc.).

Electrically insulative material 16 may comprise any suitable composition or combination of compositions; and may, for example, comprise silicon dioxide, silicon nitride, high-k oxide (with high-k oxide being any oxide having a dielectric constant greater than that of silicon dioxide) and/or doped silicon oxide (for instance, borophosphosilicate glass, phosphosilicate glass, fluorosilicate glass, etc.).

Figure 2:
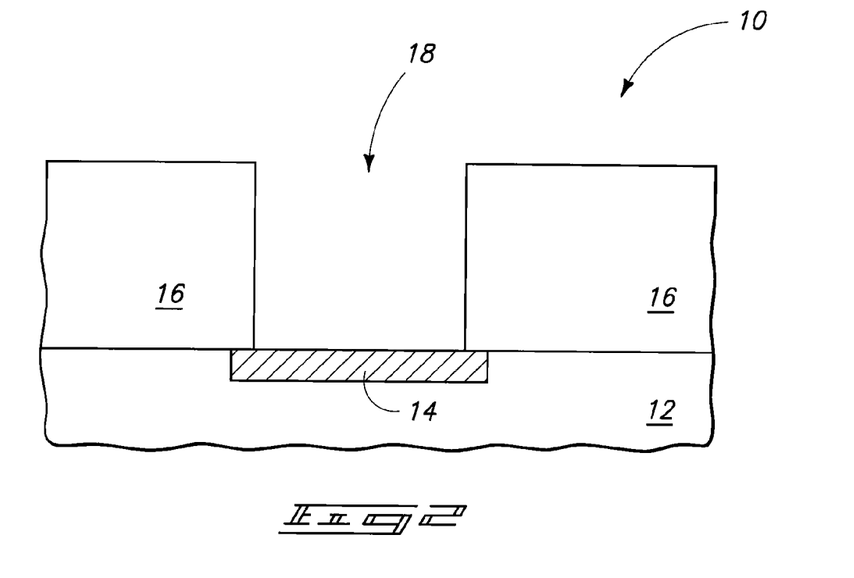
FIG. 2 is a view of the portion of FIG. 1, shown at a processing stage subsequent to that of FIG. 1.

Referring to FIG. 2, an opening 18 is etched through material 16 to expose an upper surface of electrically conductive node 14. Opening 18 may be formed by any suitable processing. For instance, opening 18 may be formed by providing a photolithographically-patterned mask (not shown) over material 16 to define a location of the opening; etching through material 16 in the defined location utilizing one or more etching compositions; and then removing the mask to leave the construction of FIG. 2.

Opening 18 may be formed to any suitable dimensions, and in any suitable shape. In some embodiments the opening may be substantially circular when viewed from above, and have a diameter of from about 10 nanometers to about 70 nanometers. The opening may have an aspect ratio of from about 2:1 to about 10:1; and accordingly may have a depth of from about 20 nanometers to about 700 nanometers.

Figure 3:
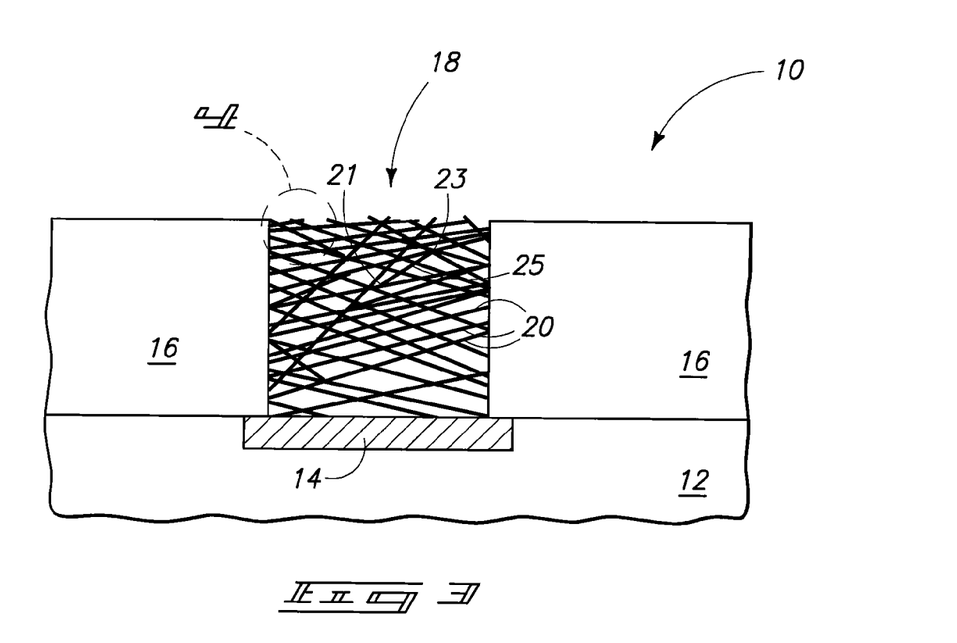
FIG. 3 is a view of the portion of FIG. 1, shown at a processing stage subsequent to that of FIG. 2.

Referring to FIG. 3, CNTs 20 (only some of which are labeled) are provided within opening 18. The CNTs are illustrated to be strands, with each CNT comprising a pair of opposing ends 21 and 23 (labeled for only one of the CNTs) and comprising a sidewall surface 25 extending between the ends (the sidewall surface is labeled only for the CNT that has the ends 21 and 23 labeled).

In the shown embodiment, most of the CNTs orient substantially horizontally within the opening.

The CNTs form a bundle (in some embodiments, a mat or fabric) within the opening. The CNTs are unordered within the opening so that the individual CNTs are askew relative to one another, and accordingly cross one another. The crossed CNTs may be utilized to form a memory device configured to store at least two data bits. In other embodiments (not shown) the CNTs may be provided within the opening in an ordered arrangement such that all of the CNTs are substantially parallel to one another. In such arrangement, the bundle of CNTs may function as a standard electrical interconnect, and would generally not have the multiple discrete electronic states appropriate for storage of two or more data bits.

The CNTs 20 may be deposited within opening 18 utilizing any suitable method. In some embodiments, the CNTs may be initially dispersed in a liquid carrier to form a mixture comprising the CNTs and the liquid. Such mixture may then be provided over material 16 and within opening 18 by, for example, spin-on methodologies. The solvent may then be evaporated to leave the bundle of CNTs within opening 18. There may also be some additional CNTs remaining over a top surface of material 16. Such additional CNTs may be removed with a rinse to leave the structure shown in FIG. 3.

Figure 4:
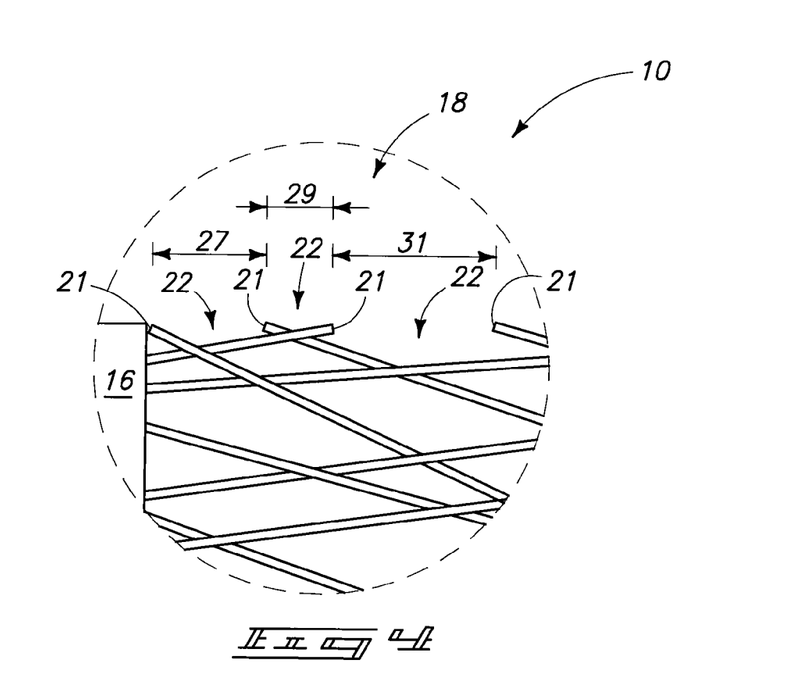
FIG. 4 is a view of an expanded region of the structure of FIG. 3.

FIG. 4 shows an expanded region of a top surface of the CNT bundle of FIG. 3. Ends 21 of the CNTs are at the top of opening 18, and spaces 22 are along the top between adjacent CNTs. The spaces 22 have numerous sizes and shapes due to the unordered arrangement of the CNTs. Lateral widths of three of the openings are shown as widths 27, 29 and 31. The width 29 is less than the widths 27 and 31, and the width 31 is larger than the width 27.

Each of the individual spaces will have a maximum lateral width. A global maximum lateral width may be defined as the greatest lateral width of any of the spaces. If lateral widths 27, 29 and 31 were the maximum lateral widths of the shown spaces, and if no space within the remainder of opening 18 had a lateral width greater than 31, then lateral width 31 would be the global maximum lateral width.

An undulating upper topography extends across the CNTs and within the spaces 22 between the CNTs.

Figure 5:
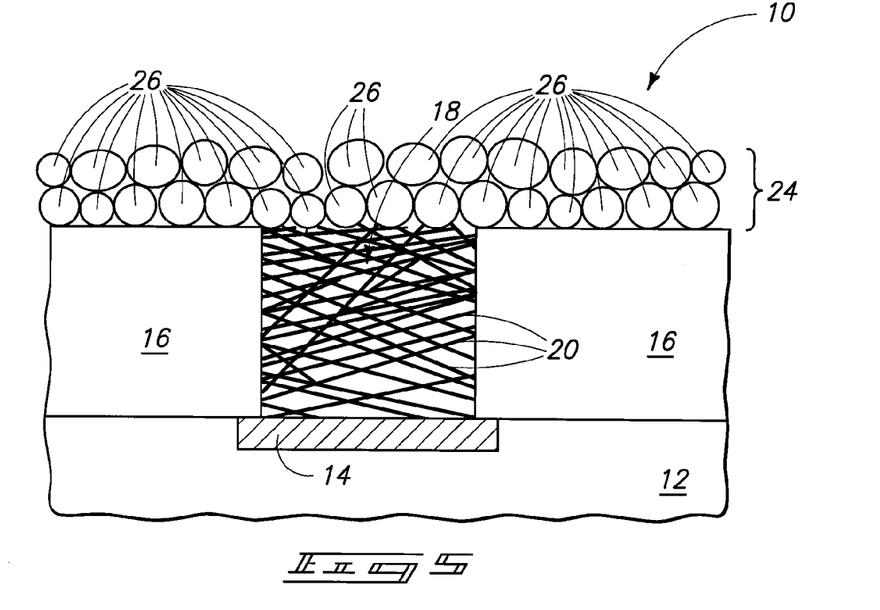
FIG. 5 is a view of the portion of FIG. 1, shown at a processing stage subsequent to that of FIG. 3.

Referring to FIG. 5, construction 10 is shown at a processing stage subsequent to that of FIG. 3, and specifically after a material 24 has been formed across opening 18. The material 24 is directly against some of the CNTs 20 within opening 18, and is shown to comprise a number of discrete particles 26. The particles 26 may be deposited by any suitable method. In some embodiments, the particles 26 may be may be nanoparticles; and may be formed cost-effectively, and to tightly-controlled tolerances with conventional methods of forming nanoparticles. The nanoparticles may then be dispersed in a liquid carrier to form a mixture, and the deposition of the particles may comprise spin-coating of such mixture across opening 18 and/or spraying of the mixture across opening 18. In some embodiments, the CNTs may be charged, and the particles may functionalized to provide them with a charge opposite to a charge of the CNTs. The liquid may be subsequently evaporated to leave the construction shown in FIG. 5.

In some embodiments, the layer 24 may be formed by physical vapor deposition (PVD), such as glancing angle PVD (3° to 8° glancing angle) coupled with wafer rotation.

Layer 24 may comprise any suitable composition or combination of compositions, and may be semiconductive, electrically insulative, or electrically conductive. In some embodiments, layer 24 may comprise, consist essentially of, or consist of metal (for instance, cobalt, palladium, tungsten, titanium, etc.) or metal-containing composition (for instance, metal silicide, metal nitride, etc.).

Figure 6:
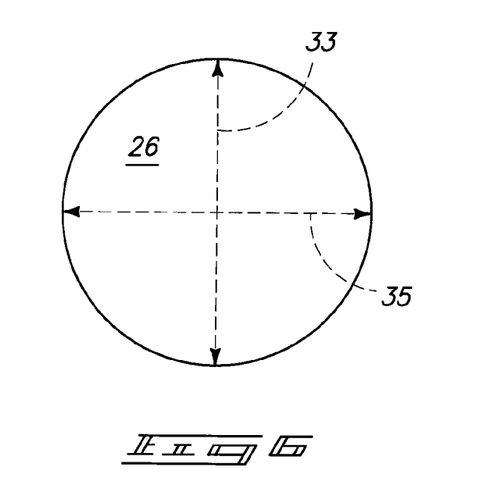
FIGS. 6 and 7 are diagrammatic, cross-sectional views of particles that may be utilized in the example embodiments.
Figure 7:
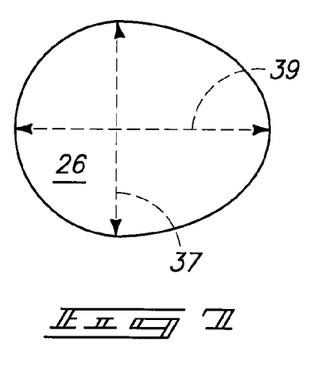

Particles 26 may have any suitable shape, and FIGS. 6 and 7 illustrate a couple of example shapes of the particles. Specifically, FIG. 6 shows a particle that is substantially circular in the cross-sectional view of the figure, and FIG. 7 shows a particle that is irregularly shaped in the cross-sectional view of the figure. The particles shown in FIGS. 6 and 7 have cross-sectional equatorial widths (33 and 35 in FIG. 6; and 37 and 39 in FIG. 7) across the widest points of the particles in vertical and horizontal directions. The equatorial widths determine a size of an opening that the particles may pass through, with the particles being unable to pass through an opening smaller than a minimum equatorial width of the particles. In some embodiments, the particles may have equatorial widths that are at least about 20 nanometers.

In some embodiments, the global maximum lateral width of the spaces between the CNTs (discussed above with reference to FIG. 4) may be considered to define a mesh, and the particles 26 may be all too large to pass through such mesh. Accordingly, none of the particles 26 passes entirely through a space between the CNTs to penetrate into the bundle of CNTs. Considered another way, each of the particles 26 may have a minimum cross-sectional equatorial width that exceeds the global maximum lateral width of the spaces between the CNTs, and accordingly none of the particles pass entirely through a space between the CNTs to penetrate into the bundle of CNTs.

Figure 8:
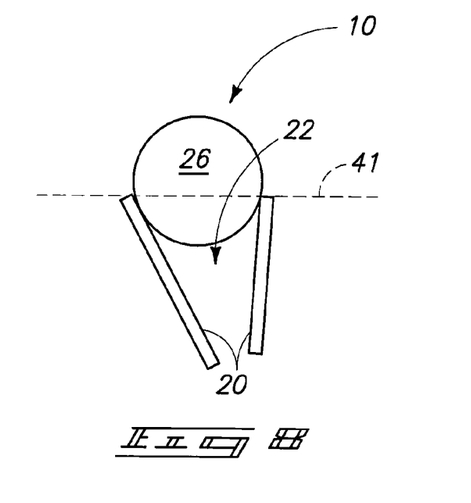
FIG. 8 is a diagrammatic, cross-sectional view of a particle supported by a CNT bundle in accordance with an example embodiment.

Even though the particles 26 cannot pass entirely through the spaces 22 between the CNTs, the particles may pass partially into such spaces. Specifically, an individual particle may pass into a space until the particle reaches a point at which the equatorial cross-section of the particle precludes further entry into the space. Such is illustrated in FIG. 8 where a particle 26 is shown supported by a pair of CNTs 20. The particle extends across a space 22 between the CNTs. Upper surfaces of the CNTs are shown to be at about a level designated by a dashed line 41 in FIG. 8. Particle 26 is shown to penetrate into opening 22 to a level such that part of particle 26 is beneath the dashed line 41. However, the particle can only penetrate partway into space 22 due to the particle eventually reaching a cross-sectional equatorial width that exceeds the width of the space 22.

Since the particles may penetrate partway into the spaces 22 in some embodiments, it may not be accurate to refer to the particles as being entirely over the CNTs in such embodiments. However, the particles may still have appropriate dimensions so that none of the particles passes entirely through a space to subsequently penetrate into the bundle of CNTs.

A problem that may occur if any of particles 26 are small enough to penetrate entirely through a space and into the bundle of CNTs is that the particles may then alter electrical properties of the bundle of CNTs. Since the number of particles passing into the CNT bundles would be non-uniform from one CNT bundle to another, and since the locations of the particles within such CNT bundles would also be non-uniform from one CNT bundle to another, the electrical properties of various CNT bundles would be non-uniform relative to one another. One use for the CNT bundles is as memory devices, and in such use it is desired to form a large array of CNT bundles that are electrically identical under the operating parameters utilized for the memory devices. Thus, it is desired to preclude migration of any of material 24 into the CNT bundles, and accordingly it is desired to preclude migration of the individual particle 26 into the CNT bundles.

Figure 9:
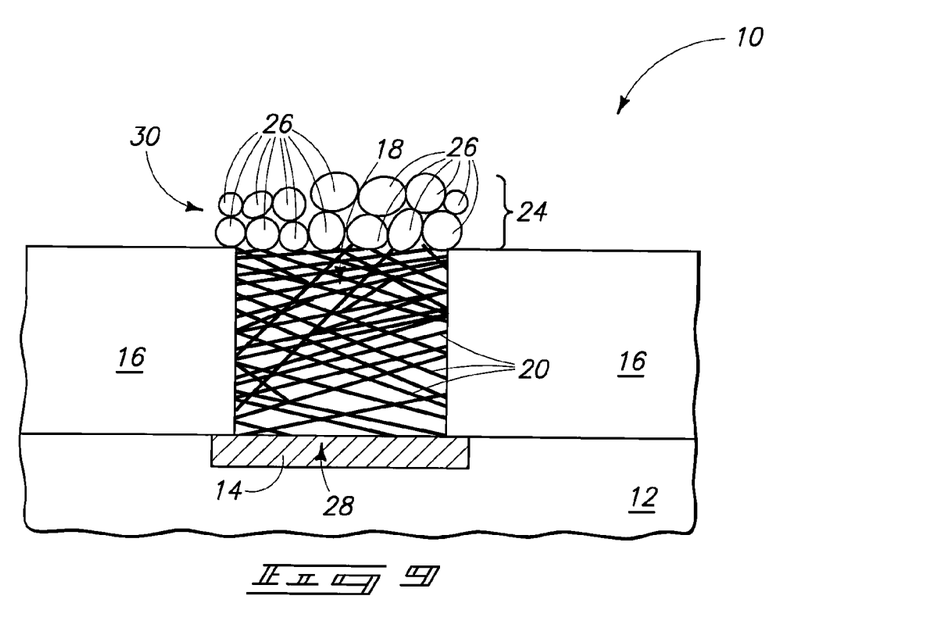
FIG. 9 is a view of the portion of FIG. 1, shown at a processing stage subsequent to that of FIG. 5.

Referring to FIG. 9, material 24 is patterned to leave a segment of the material over the CNT bundle, while removing material 24 from over some of the surface of material 16. In embodiments in which the CNT bundles are to be memory devices, such may electrically isolate the individual memory devices of an array from one another, while leaving material 24 as patterned electrodes over the memory devices. For instance, the construction of FIG. 9 may be considered to comprise electrically conductive material 14 as a first electrode 28 beneath the CNT bundle, and to comprise material 24 as a second electrode 30 over the CNT bundle. The electrodes 28 and 30 may be utilized to store data in the CNT bundle by changing an electrical state of the CNT bundle to one of several available states, or to read data from the CNT bundle by ascertaining which of the available states the CNT bundle is utilizing.

Figure 10:
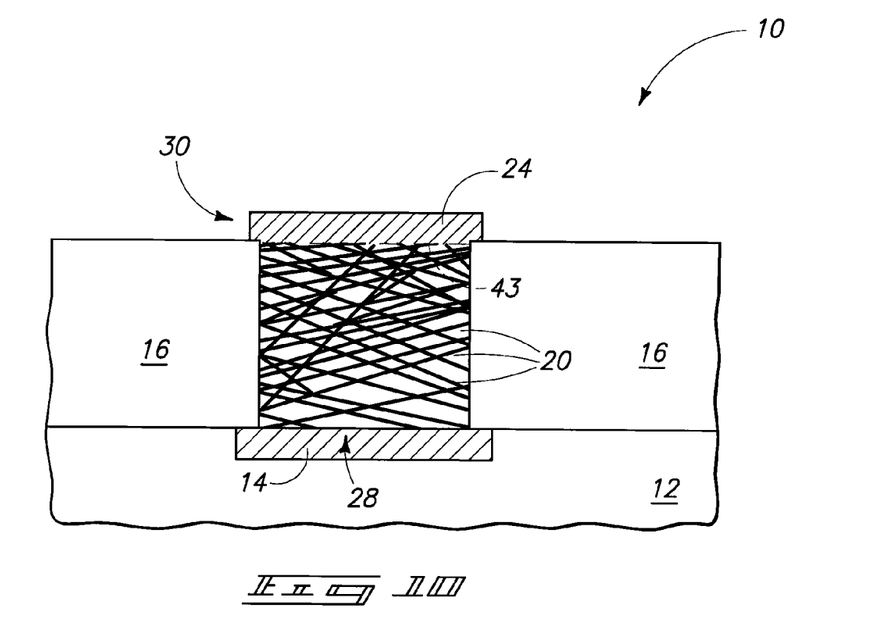
FIG. 10 shows the same portion shown in FIG. 9 at the same processing stage as FIG. 9, in accordance with an alternative way of illustrating such portion.

FIG. 9 shows one method of illustrating material 24 over the bundle of CNTs 20. Another method is shown in FIG. 10. Specifically, FIG. 10 shows material 24 as a homogeneous electrically conductive composition over the bundle of CNTs 20, and does not show the individual discrete particles 26 (FIG. 9). The illustrative method of FIG. 10 simplifies the drawings, and will be used in several of the drawings that follow. However, even though material 24 is shown as a homogeneous material without illustration of the discrete particles 26, it is to be understood that the material may be formed of such discrete particles. Alternatively, the discrete particles 26 may be subjected to processing (for instance, thermal processing) to fuse the particles together to form an actual homogenous layer from the particles (with the term "homogeneous layer" meaning a layer having no internal physical boundaries).

A bottom surface of material 24 is shown in FIG. 10 by a dashed line 43. The dashed line is used to indicate that material 24 may not have a well-defined planar bottom surface, but may instead have a bottom surface with regions that penetrate partially into the bundle of CNTs 20 due to some of the particles 26 penetrating partially into the spaces 22 (as is described above with reference to FIG. 8).

Figure 11:
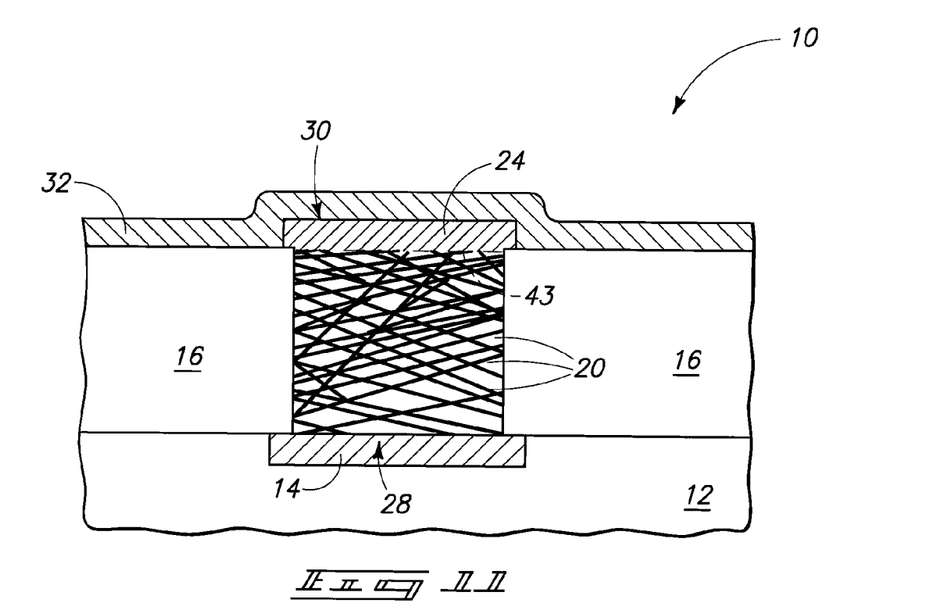
FIG. 11 is a view of the portion of FIG. 1 shown at a processing stage subsequent to that of FIG. 10, and illustrated in accordance with the way shown in FIG. 10.

Referring to FIG. 11, a conductive material 32 may be formed over the top electrode 30 to interconnect such top electrode with other circuitry (not shown). Similarly, bottom electrode 28 may be connected with other circuitry through electrical interconnects (not shown).

Conductive material 32 may comprise any suitable composition or combination of compositions, and may, for example, comprise metal and/or metal-containing compounds. For instance, material 32 may comprise, consist essentially of, or consist of titanium nitride. Material 32 may be formed by any suitable methodology, and may, for example, be deposited utilizing one or more of atomic layer deposition (ALD), chemical vapor deposition (CVD), and physical vapor deposition (PVD). In some embodiments, material 24 may be referred to as a first material formed over the bundle of CNTs 20; and material 32 may be referred to as a second material that is formed over the bundle of CNTs, and spaced from the CNTs by the first material 24.

Figure 12:
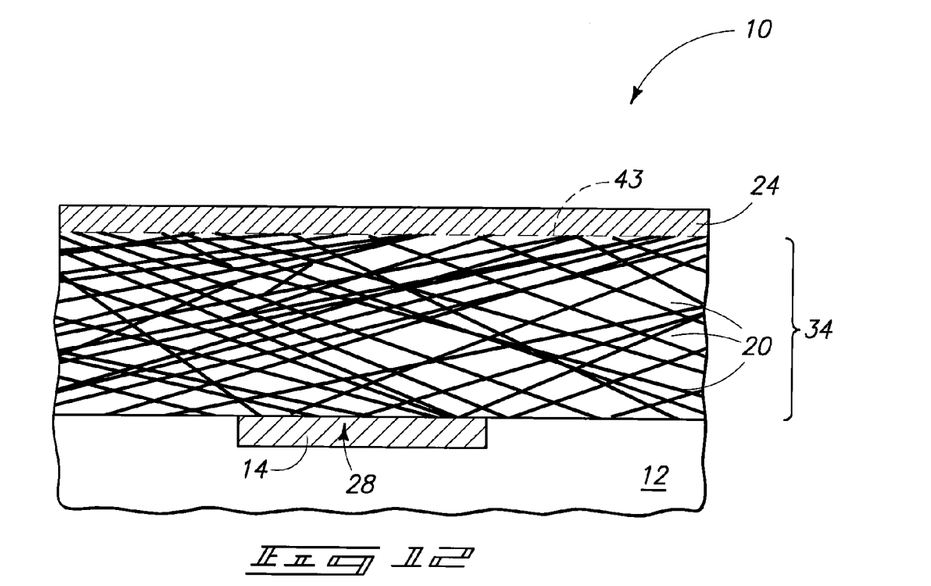
FIGS. 12-14 are views of the portion of FIG. 1, shown at processing stages subsequent to FIG. 1 in accordance with another example embodiment.
Figure 13:
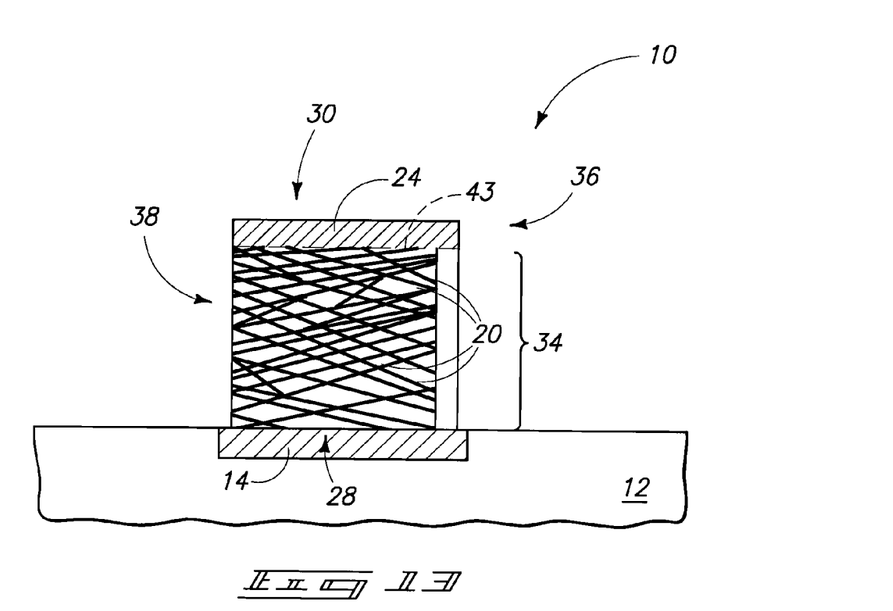
Figure 14:
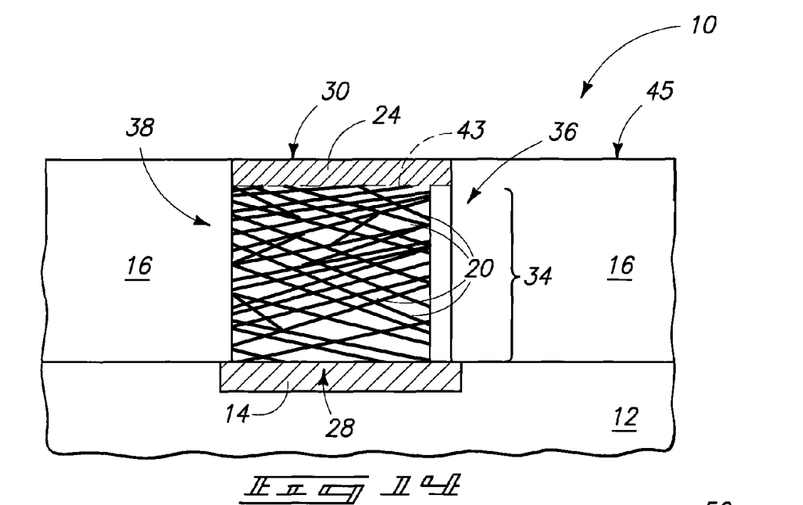

The embodiment of FIGS. 1-11 forms a bundle of CNTs 20 sandwiched between a pair of electrodes 28 and 30. Such embodiment patterns the bundles of CNTs by placing such bundle within an opening in an electrically insulative material 16, and then patterns the second electrode 30 in a processing step separate from the patterning of the bundle of CNTs. There may be difficulties associated with alignment of the second electrode and the bundle of CNTs due to the utilization of separate patterning steps for the patterning of the second electrode and the bundle of CNTs. FIGS. 12-14 illustrate another example embodiment for forming a structure of the type shown in FIG. 10, with the embodiment of FIGS. 12-14 utilizing a single patterning step to simultaneously pattern both the bundle of CNTs and the top electrode.

Referring to FIG. 12, construction 10 is shown at a processing stage alternative to that of FIG. 1. The construction shown in FIG. 12 includes the substrate 12, and the electrically conductive node 14 that were discussed previously. The construction further includes a mat 34 of CNTs 20 (only some of which are labeled), and an electrically conductive material 24 over the mat.

Mat 34 may be formed utilizing processing analogous to that discussed above with reference to FIG. 3. Specifically, a mixture of CNTs in carrier liquid may be provided across substrate 12, and then the carrier liquid may be evaporated to leave the mat 34 of CNTs remaining over the substrate.

The material 24 may be formed with processing analogous to that discussed above with reference to FIG. 5. Specifically, a plurality of particles of size large enough not to pass entirely into mat 34 may be deposited over the mat. Such deposition may utilize one or more of the spin-on, spraying and PVD technologies discussed above.

Material 24 is illustrated in the way discussed above with reference to FIG. 10, and thus is shown as a uniform conductive layer rather than showing the individual particles utilized to form the material. The material 24 of FIG. 12 is shown with an indeterminate bottom surface. Specifically, a dashed line 43 is utilized to diagrammatically illustrate that the bottom surface may not be a clearly defined planar bottom surface, but instead may have regions that penetrate partially into the mat 34 due to some of the particles 26 penetrating partially into the spaces 22 (as is described above with reference to FIG. 8).

Referring to FIG. 13, mat 34 and conductive material 24 are together patterned to form a feature 36 supported by substrate 12. The mat 34 and conductive material 24 may be patterned with any suitable methodology. For instance, a photolithographically-patterned mask (not shown) may be formed over material 24 to define a location of the feature 36; material 24 and mat 34 may then be etched utilizing one or more etching compositions to transfer a pattern from the mask into material 24 and mat 34; and then the mask may be removed to leave the construction of FIG. 13.

The patterning of material 24 forms the material into electrode 30, and forms the mat into a memory cell body 38. An advantage of simultaneously patterning mat 34 and material 24 is that the electrode 30 and the memory cell body 38 are aligned with one another as a result of the patterning. In the shown embodiment, the memory cell body is also aligned with the electrode 28, and is sandwiched between the electrodes 28 and 30.

Referring to FIG. 14, electrically insulative material 16 is fowled along the sides of electrode 30, and along the sides of memory cell body 38. The insulative material 16 may be formed by any suitable processing, including, for example, one or more of ALD, CVD, PVD and spin-on technologies. In some embodiments, the insulative material 16 will be initially deposited over electrode 30, as well as along the sides of electrode 30 and memory cell body 38. It may be desired to remove the insulative material 16 from over electrode 30 to form the construction of FIG. 14. In the shown embodiment, a planar surface 45 extends across insulative material 16 and electrode 30. Such planer surface may be formed utilizing planarization (for instance, chemical-mechanical polishing) to remove insulative material 16 from over electrode 30.

The embodiments of FIGS. 1-14 utilize CNT bundles to form memory cells that extend primarily vertically over a semiconductor substrate, and utilize deposited particles to form upper electrodes of the memory cells. There are numerous other uses for CNT bundles, and numerous other applications for deposited particles. FIGS. 15-23 describe additional example embodiments that utilize CNT bundles.

Figure 15:
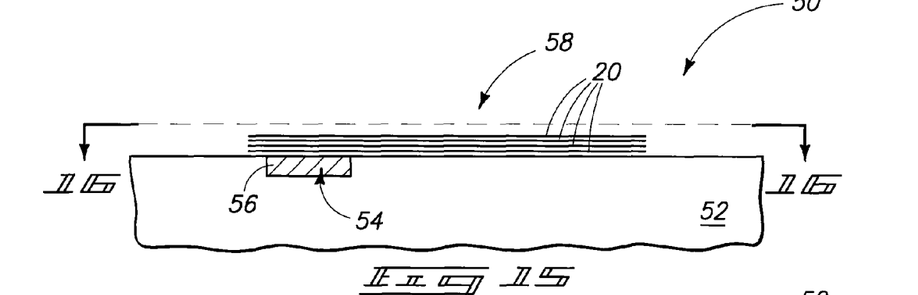
FIG. 15 is a diagrammatic, cross-sectional view of a portion of a semiconductor construction at a processing stage of another example embodiment.

Referring to FIG. 15, a portion of a semiconductor construction 50 is illustrated. The construction 50 includes a semiconductor substrate 52 supporting a first electrical node 54.

Substrate 52 may comprise any of the compositions discussed above regarding substrate 12.

The first electrical node comprises electrically conductive material 56, which may include any of the compositions discussed above with reference to electrically conductive material 14.

A plurality of CNTs 20 (only some of which are labeled) are over substrate 52 and electrical node 54. The CNTs together form a carbon nanotube-containing structure (CNT-containing structure) 58. In the shown embodiment, such structure is a line.

Figure 16:
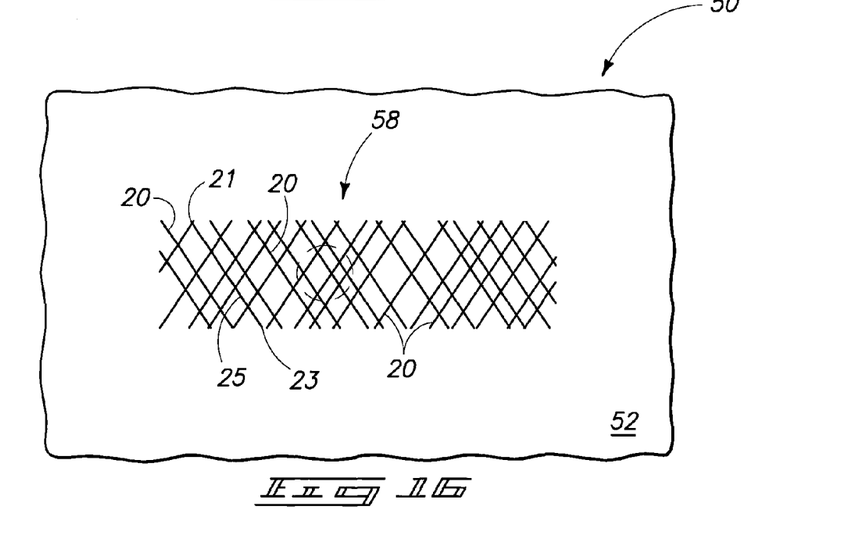
FIG. 16 is a top view of the portion shown in FIG. 15.

FIG. 16 shows a top view of construction 50, and shows that the CNT-containing structure 58 comprises a plurality of CNTs 20 (only some of which are labeled) that are unordered, and accordingly that cross one another within the structure. In other embodiments (which are not shown), the CNTs may be ordered (for instance, may be aligned parallel to one another).

The individual CNTs 20 of FIG. 16 comprise the pair of opposing ends 21 and 23 (labeled for only one of the CNTs), and comprise the sidewall surface 25 extending between the ends (the sidewall surface is labeled only for the CNT that has the ends 21 and 23 labeled).

Figure 17:
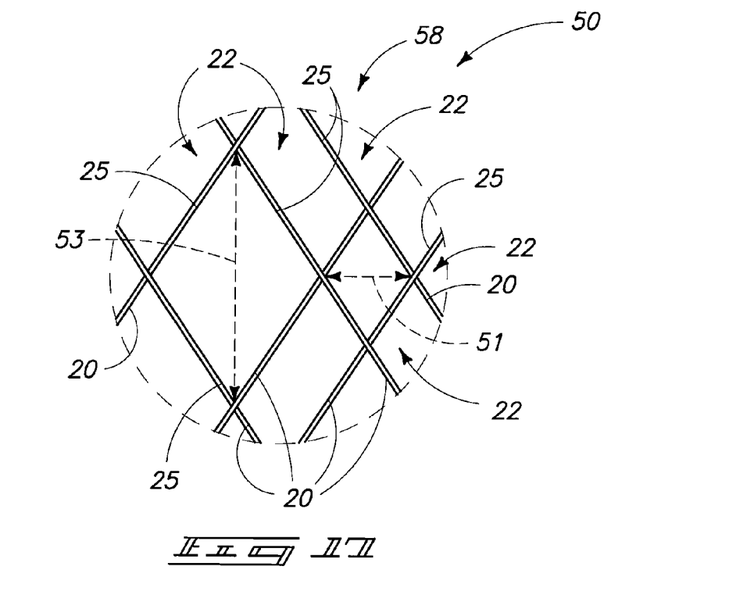
FIG. 17 is a view of an expanded region of the structure of FIG. 16.

FIG. 17 shows an expanded region of a top surface of the CNT-containing structure of FIG. 16, and shows spaces 22 between the CNTs. The CNTs of FIGS. 16 and 17 are primarily horizontally-oriented across substrate 52 (FIG. 16). Accordingly, spaces 22 of FIG. 17 are between sidewall surfaces 25 of horizontally-aligned CNTs.

The spaces 22 of FIG. 16 have numerous sizes and shapes due to the unordered arrangement of the CNTs. Lateral widths of two of the openings are shown as widths 51 and 53. The width 53 is larger than the width 51.

Each of the individual spaces will have a maximum lateral width. A global maximum lateral width may be defined as the greatest lateral width of any of the spaces. If lateral widths 51 and 53 are the maximum lateral widths of the shown spaces, and if no space along an upper periphery of the remainder of CNT-containing structure 58 has a lateral width greater than 53, then lateral width 51 would be the global maximum lateral width along the upper periphery of the CNT-containing structure.

An undulating upper topography extends across the CNTs of structure 58, and within the spaces 22 between the CNTs.

Figure 18:
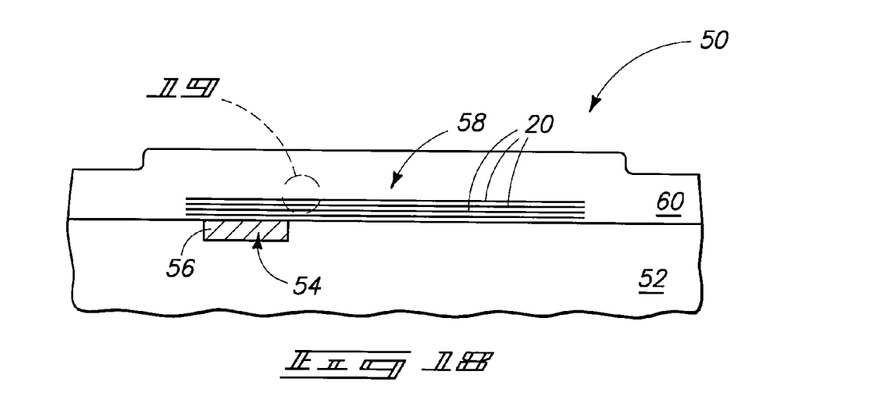
FIG. 18 is a view of the portion of FIG. 15, shown at a processing stage subsequent to that of FIG. 15.

Referring to FIG. 18, a protective material 60 is deposited over substrate 52, and across CNT-containing structure 58. Material 60 may comprise any suitable composition, and in some embodiments may be a dielectric. In such embodiments, material 60 may comprise, consist essentially of, or consist of one or both of silicon dioxide and silicon nitride. Alternatively, or additionally, material 60 may comprise silica and/or one or more polymers.

Material 60 protects CNT-containing structure 58 from being exposed to oxidant or other reactive substances that may alter electrical properties of the CNT-containing structure. In some embodiments, material 60 may be considered to be a passivating material.

Figure 19:
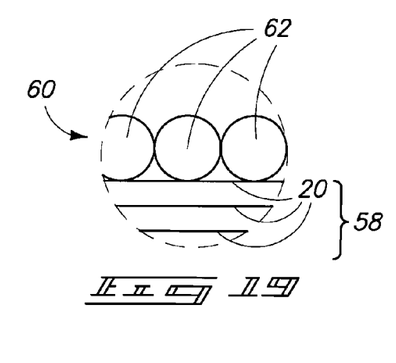
FIG. 19 is a view of an expanded region of the structure of FIG. 18.

Material 60 may be composed of a plurality of individual particles, and such particles may be deposited by one or more of the methods discussed above regarding FIG. 5. FIG. 19 shows an expanded region of FIG. 18, and shows the material 60 comprised of discrete particles 62.

Particles 62 may comprise any suitable composition or combination of compositions, and may be electrically insulative in some embodiments. In such embodiments, particles 62 may comprise, consist essentially of, or consist of one or both of silicon dioxide and silicon nitride.

Figure 20:
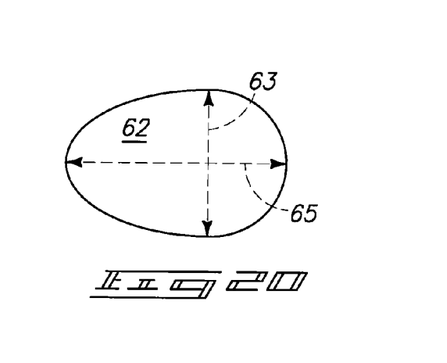
FIG. 20 is a diagrammatic, cross-sectional view of a particle that may be utilized in the example embodiment of FIG. 18.

Particles 62 may have any suitable shape, such as, for example, the shapes discussed above with reference to FIGS. 6 and 7. FIG. 20 shows an example particle 62. The particle shown in FIG. 20 has cross-sectional equatorial widths 63 and 65 across the widest points of the particle in vertical and horizontal directions. The equatorial widths determine a size of a mesh that the particles may pass through. In some embodiments, the global maximum lateral width of the spaces between the CNTs (discussed above with reference to FIG. 17) may be considered to define a mesh, and the particles 62 may be all too large to pass through such mesh. Accordingly, none of the particles 62 passes entirely through a space between the CNTs to penetrate into the CNT-containing structure 58. In other words, each of the particles 62 may have a minimum cross-sectional equatorial width that exceeds the global maximum lateral width of the spaces between the CNTs. Accordingly, none of the particles pass entirely through a space between the CNTs to penetrate into the CNT-containing structure 58.

Even though the particles 62 cannot pass entirely through the spaces 22 between the CNTs, the particles may pass partially into such spaces, analogous to the partial penetration of the particles into a CNT bundle that was discussed above with reference to FIG. 8. However, the particles may still have appropriate dimensions so that none of the particles passes entirely through a space to subsequently penetrate into the CNT-containing structure 58.

A problem that may occur if any of particles 62 are small enough to penetrate entirely through a space and into the CNT-containing structure 58 is that the particles may then alter electrical properties of the CNT-containing structure 58.

After material 60 is formed, additional processing may be utilized to form a second electrode in electrical connection with CNT-containing structure 58, as is described with reference to FIGS. 21 and 22.

Figure 21:
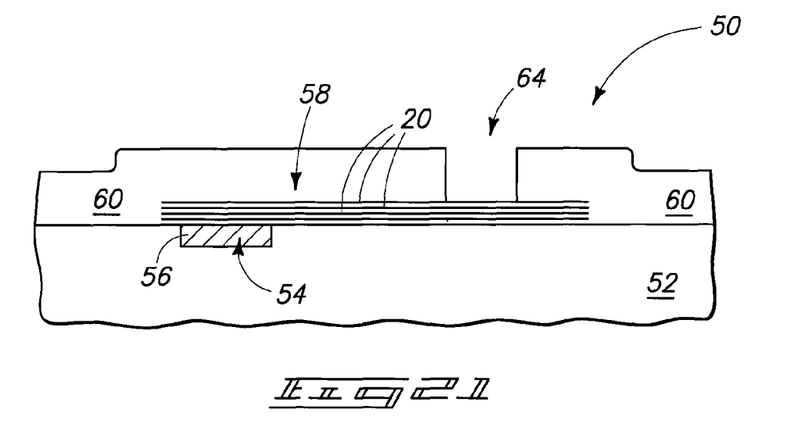
FIG. 21 is a view of the portion of FIG. 15, shown at a processing stage subsequent to that of FIG. 18.

FIG. 21 shows construction 50 after an opening 64 has been formed through material 60 to expose an upper surface of CNT-containing structure 58. Opening 64 may be formed by any suitable processing. For instance, a photolithographically-patterned mask (not shown) may be formed over material 62 to define a location of the opening 64; the opening may then be etched through material 60 with an appropriate etching composition; and subsequently the photoresist mask may be removed to leave the structure shown in FIG. 21. The formation of the opening may include cleaning of etchant debris from within the opening and/or sealing across a porous upper edge of CNT-containing structure 58. The etching, cleaning and sealing may utilize spacer-like dielectric liners (not shown), dry only post etch cleans, high volatility solvent cleans, and/or metal liners appropriate for pore sealing.

Figure 22:
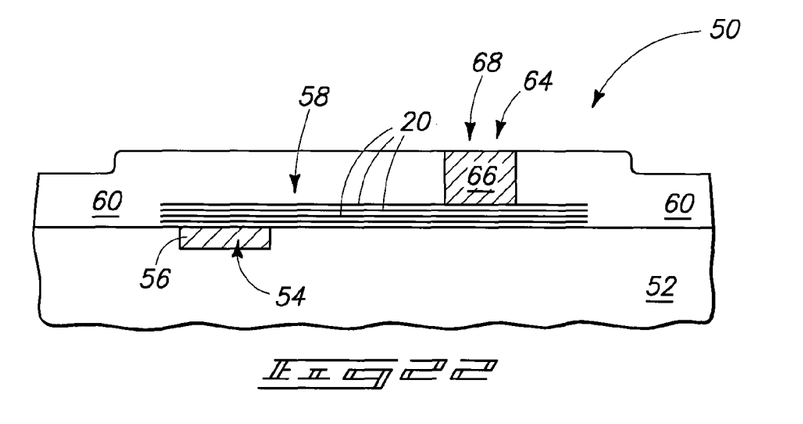
FIG. 22 is a view of the portion of FIG. 15, shown at a processing stage subsequent to that of FIG. 21.

Referring to FIG. 22, electrically conductive material 66 is formed within opening 64. The electrically conductive material may comprise any suitable composition or combination of compositions. For instance, the electrically conductive material may comprise one or more of conductively-doped semiconductor material, metal, and/or metal-containing compositions. In some embodiments, material 66 may comprise, consist essentially of, or consist of palladium.

Material 66 may be deposited as a plurality of particles that are individually too large to pass through spaces 22 (FIG. 17) between the CNTs, and such deposition may utilize one or more of the methods discussed above with reference to FIG. 5. In some embodiments, the deposition of the conductive material 66 forms a conductive material across material 60 as well as within opening 64. The conductive material is subsequently removed from over material 64 with one or both of etching and planarization to leave the construction shown in FIG. 22.

Material 66 forms a second electrode 68 that is electrically connected to the CNT-containing structure 58. In operation, first electrode 54 and second electrode 68 may be utilized to flow electrical current to and from CNT-containing structure 58. In some embodiments, CNT-containing structure 58 may be the body of a memory cell, and such memory cell may be utilized to store two or more data bits. Accordingly, in some embodiments, the electrodes 54 and 68, together with CNT-containing structure 58, may be considered to be a memory device configured for storage of two or more data bits.

The processing of FIGS. 21 and 22 exposes a region of CNT-containing structure 58 within the opening 64, and then forms material 66 as a seal across the exposed region. If structure 58 is exposed to oxidant or other substances that may impact performance of the CNT-containing structure while the structure is exposed within opening 64, problems may occur in attempting to create devices that operate within desired tolerances. Accordingly, it may be desired to keep construction 50 within a single sealed chamber from the processing stage at which formation of opening 64 is initiated until the processing stage at which formation of conductive material 66 is completed. The ambient within such chamber may be inert relative to reaction with CNTs 20 and/or relative to any other effect on the properties of CNT-containing structure 58, at least during the time that CNTs 20 are exposed within opening 64. Such an inert ambient may comprise non-reactive gases, such as, for example, argon, nitrogen ($N_2$), etc.; and/or may comprise vacuum (for instance, a pressure of less than or equal to about 10 torr).

Figure 23:
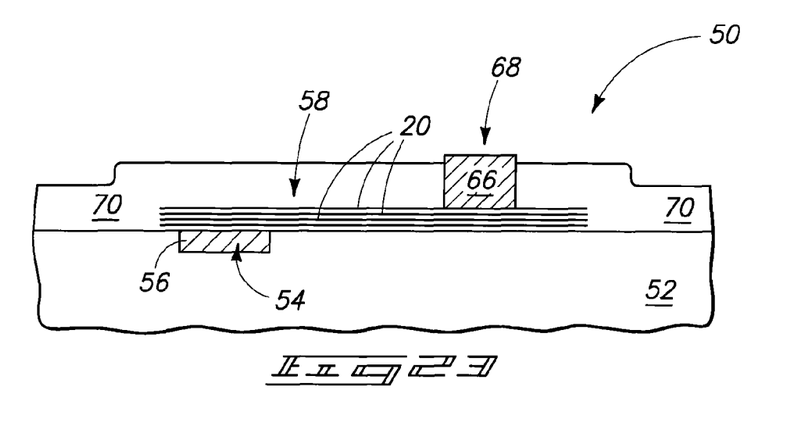
FIG. 23 is a view of the portion of FIG. 15, shown at a processing stage subsequent to that of FIG. 22.

The material 60 may remain over CNT-containing structure 58 in some embodiments, or may be a sacrificial material that is replaced after formation of electrode 68. FIG. 23 shows construction 50 at a processing stage subsequent to FIG. 22 in accordance with an example embodiment in which material 60 (FIG. 22) has been replaced with material 70. Material 70 may be electrically insulative material that forms a passivating composition across CNT-containing structure 58; and may, for example, comprise, consist essentially of, or consist of one or both of silicon dioxide and silicon nitride. Alternatively, or additionally, material 70 may comprise silica and/or one or more polymers.

Material 70 may be comprised of a plurality of particles that individually are too large to fall through the spaces 22 (FIG. 17) within CNT-containing structure 58.

The replacement of material 60 with material 70 comprises removal of material 60 to expose the CNT-containing structure 58, followed by deposition of material 70. It may be desired that structure 50 remain within a sealed chamber during the time that CNTs 20 are exposed, and that the ambient within such chamber may be inert relative to reaction with CNTs 20 and/or relative to any other effect on the properties of CNT-containing structure 58. Accordingly, in embodiments in which material 60 is replaced with material 70, construction 50 may be kept within a single sealed chamber from the processing stage at which formation of opening 64 is initiated (i.e., from a processing stage immediate the shown stages of FIGS. 18 and 21) until the processing stage at which formation of material 70 is completed (i.e., the processing stage shown in FIG. 23).

In some embodiments, material 70 may be deposited across electrode 68, as well as across exposed portions of CNT-containing structure 58. In such embodiments, material 70 may be removed from over electrode 68 with subsequent planarization and/or etching to leave the structure shown in FIG. 23; or alternatively insulative material 70 may be left over electrode 68. Electrode 68 may be connected to other circuitry (not shown) either by interconnects extending into and out of the page relative to the cross-sectional view of FIG. 23, or by interconnects (not shown) formed to extend through material 70.

The example embodiments of FIGS. 1-23 form various materials in direct contact with CNT-containing bundles. The resulting constructions may be memory devices, and may be formed as a large array of memory devices suitable for incorporation into various electrical systems. Alternatively, the resulting constructions may be utilized as other integrated circuit structures, and/or may be incorporated into other semiconductor constructions, such as, for example, MEMS.

In any of the embodiments described above, the discrete particles deposited over a bundle of nanotubes (for instance, the particles 26 of FIG. 5) may be subjected to processing (for instance, thermal processing) to fuse the particles together. In some embodiments, such fusing may form a homogenous layer from the particles.

FIGS. 24-27 illustrate example electrical systems that may utilize memory devices formed in accordance with the example embodiments of FIGS. 1-23.

Figure 24:
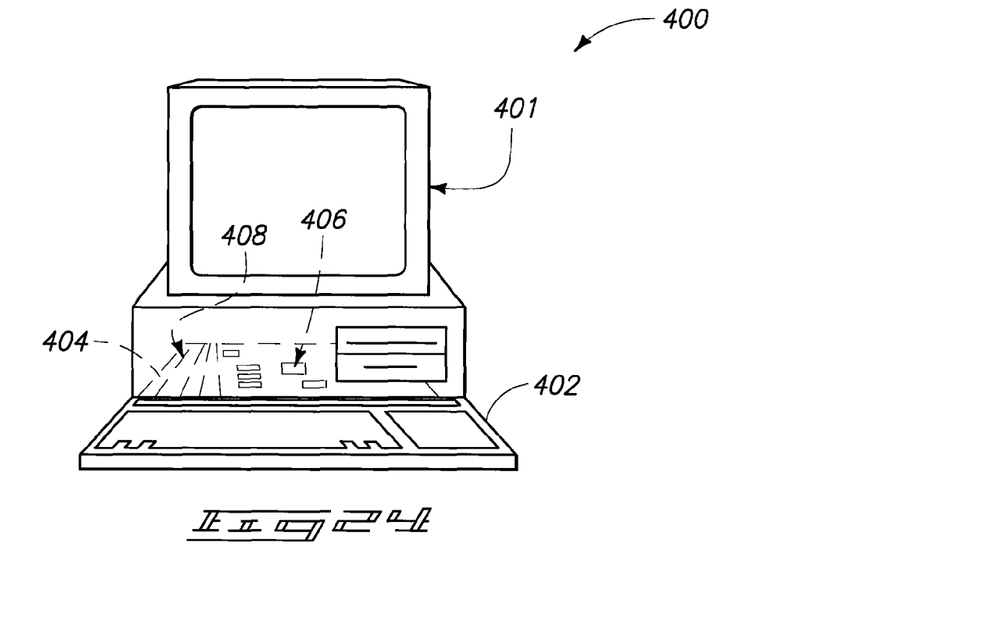
FIG. 24 is a diagrammatic view of a computer embodiment.

FIG. 24 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 25. In such block diagram, the addressing circuitry is illustrated as 410 and the read circuitry is illustrated as 412.

Figure 25:
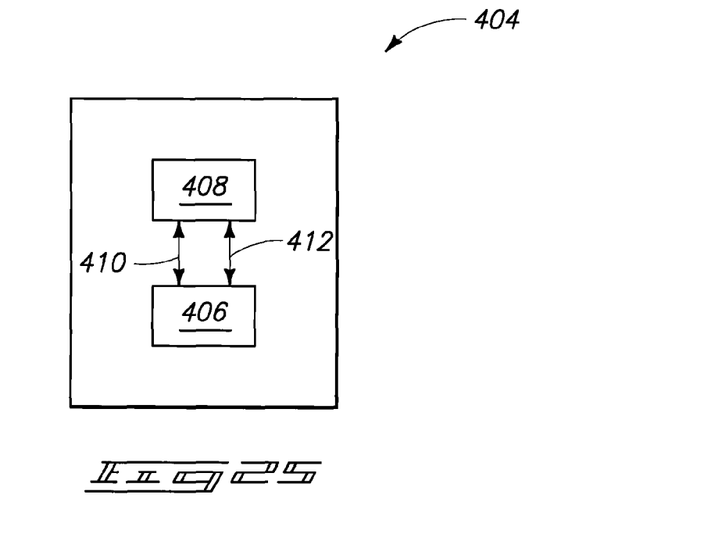
FIG. 25 is a block diagram showing particular features of the motherboard of the FIG. 24 computer embodiment.

Processor device 406 may correspond to a processor module, and associated memory utilized with the module may comprise memory devices formed in accordance with the example embodiments of FIGS. 1-23.

Memory device 408 may correspond to a memory module, and may comprise memory devices formed in accordance with the example embodiments of FIGS. 1-23.

Figure 26:
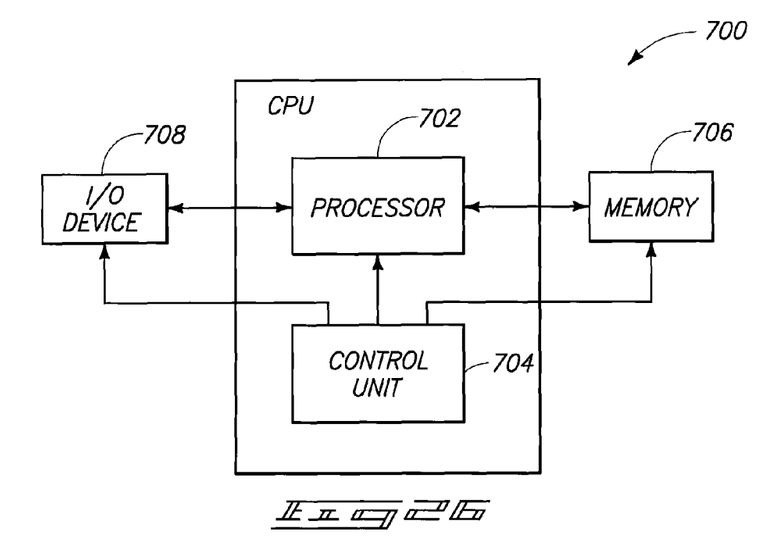
FIG. 26 is a high level block diagram of an electronic system embodiment.

FIG. 26 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory unit 706 and an input/output (I/O) device 708 (it is to be understood that the system may have a plurality of processors, control units, memory units and/or I/O devices in various embodiments). Generally, electronic system 700 will have a native set of instructions that specify operations to be performed on data by the processor 702 and other interactions between the processor 702, the memory unit 706 and the I/O device 708. The control unit 704 coordinates all operations of the processor 702, the memory unit 706 and the I/O device 708 by continuously cycling through a set of operations that cause instructions to be fetched from the memory unit 706 and executed. The memory unit 706 may be a memory device formed in accordance with the example embodiments of FIGS. 1-23.

Figure 27:
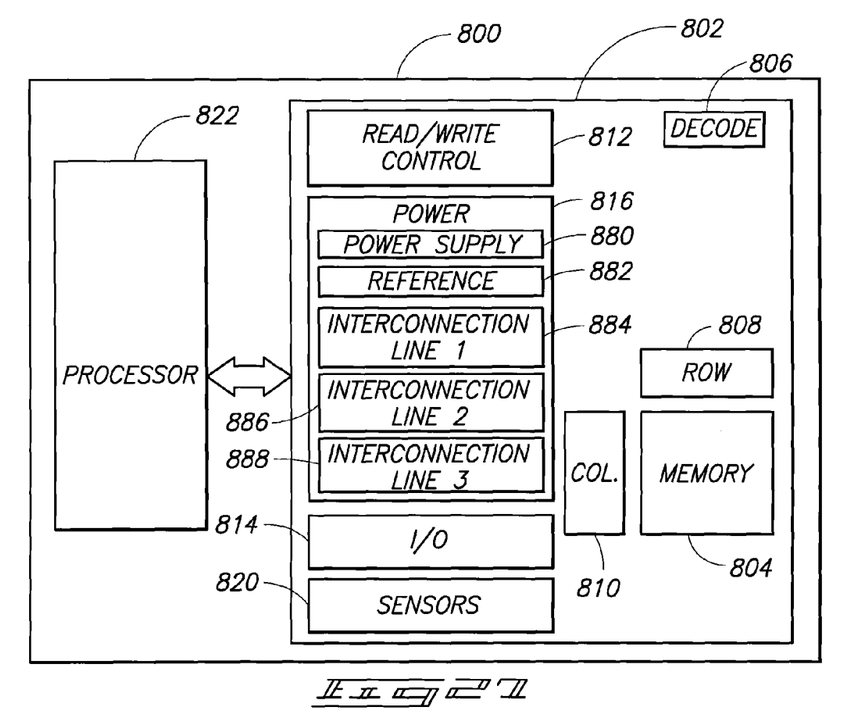
FIG. 27 is a simplified block diagram of a memory device embodiment.

FIG. 27 is a simplified block diagram of an electronic system 800. The system 800 includes a memory structure 802 that has an array of memory cells 804, address decoder 806, row access circuitry 808, column access circuitry 810, read/write control circuitry 812 for controlling operations, and input/output circuitry 814. The memory structure 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, interconnection line 884 for providing a first wordline with pulses, interconnection line 886 for providing a second wordline with pulses, and interconnection line 888 for providing a bitline with pulses. The system 800 also includes a processor 822, or memory controller for memory accessing.

The memory structure 802 receives control signals from the processor 822 over wiring or metallization lines. The memory structure 802 is used to store data which is accessed via I/O lines. At least one of the processor 822 and memory structure 802 may include memory devices formed in accordance with the example embodiments of FIGS. 1-23.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a device, comprising:
   providing a plurality of crossed carbon nanotubes over a semiconductor substrate, the crossed carbon nanotubes forming an undulating upper topography extending across the carbon nanotubes and within spaces between the carbon nanotubes, the spaces having maximum lateral widths, a global maximum lateral width being the greatest lateral width of any of the spaces; and
   depositing a material over the crossed nanotubes, the material being deposited as particles that have minimum cross-sectional equatorial widths exceeding the global maximum lateral width.

2. The method of claim 1 further comprising, after depositing the particles, fusing the particles together.

3. The method of claim 1 wherein the particles are provided in a mixture with a liquid carrier, and wherein the depositing of the material comprises spin-coating the mixture over the crossed nanotubes or spraying the mixture over the crossed nanotubes.

4. The method of claim 3 further comprising providing a charge to the carbon nanotubes, and providing a charge on the particles that is opposite to that of the carbon nanotubes during the deposition of the particles.

5. The method of claim 1 wherein the material is electrically conductive.

6. The method of claim 1 wherein the material is electrically insulative.

7. The method of claim 1 wherein the material consists of metal.

8. The method of claim 1 wherein the material consists of Pd.

9. The method of claim 1 wherein the material comprises at least one of silicon dioxide and silicon nitride.

10. The method of claim 1 wherein the material is a plurality of electrically conductive particles, and is a first material; the method further comprising depositing a second material over the first material, the depositing of the second material utilizing one or more of ALD, CVD and PVD.

11. The method of claim 1 wherein the device is a memory device configured to store at least two data bits.

12. A method of forming a device, comprising:
   providing a carbon nanotube-containing structure across a substrate, the structure comprising a plurality of carbon nanotubes;
   forming a protective material over the carbon nanotube-containing structure;
   after forming the protective material; etching an opening through the protective material to expose a region of the carbon nanotube-containing structure;
   at least partially filling the opening with electrically conductive material to form an electrode over and in direct physical contact with the carbon nanotube-containing structure;
   wherein the etching of the opening, and the at least partially filling of the opening, are conducted in a sealed chamber under an atmosphere that is inert relative to reaction with the carbon nanotubes; and
   wherein:
      the carbon nanotubes cross one another, the crossed carbon nanotubes forming an undulating upper topography extending over the carbon nanotubes and within spaces between the carbon nanotubes, the spaces having maximum lateral widths, a global maximum lateral width being the greatest lateral width of any of the spaces;
      the electrically conductive material comprises a plurality of particles that have minimum cross-sectional equatorial widths exceeding the global maximum lateral width; and
      no particles of the electrically conductive material have cross-sectional equatorial widths less than the global maximum lateral width and penetrate into the crossed carbon nanotubes.

13. The method of claim 12 wherein the atmosphere comprises one or both of nitrogen and argon.

14. The method of claim 12 wherein the protective material is a dielectric material.

15. The method of claim 12 wherein the electrode is a second electrode, and wherein the substrate includes an electrically conductive first electrode, and wherein the carbon nanotube-containing structure is formed over and directly against the first electrode.

16. The method of claim 12 further comprising, after forming the electrode:
   removing the protective material to expose a section of the carbon nanotube-containing structure proximate the electrode;
   forming a dielectric material over the exposed section of the carbon nanotube-containing structure; and
   wherein the removing of the protective material, and the forming the dielectric material, are conducted in a sealed chamber under an atmosphere that is inert relative to reaction with the carbon nanotubes.

* * * * *